(12) United States Patent
Tsubota

(10) Patent No.: US 6,226,309 B1
(45) Date of Patent: *May 1, 2001

(54) SEMICONDUCTOR LASER AND LIGHT SOURCE

(75) Inventor: Takashi Tsubota, Tokyo (JP)

(73) Assignee: Oki Electric Industry Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/917,349

(22) Filed: Aug. 26, 1997

(30) Foreign Application Priority Data

Sep. 10, 1996 (JP) .................................... 7-238743

(51) Int. Cl.$^7$ ........................................ H01S 3/79
(52) U.S. Cl. ................................. 372/49; 372/46
(58) Field of Search ............................ 372/49, 50, 92, 372/99, 46

(56) References Cited

U.S. PATENT DOCUMENTS

| | | | |
|---|---|---|---|
| 4,794,609 | * 12/1988 | Hara et al. | 372/49 |
| 4,843,610 | * 6/1989 | Okada et al. | 372/49 |
| 4,852,112 | 7/1989 | Kagawa et al. | 372/49 |
| 4,860,305 | * 8/1989 | Miyauchi et al. | 372/49 |
| 4,914,668 | 4/1990 | Nagal et al. | 372/49 |
| 4,989,214 | * 1/1991 | Kwa | 372/50 |
| 5,323,411 | * 6/1994 | Shirasaka et al. | 372/50 |
| 5,412,675 | * 5/1995 | Odagawa | 372/50 |
| 5,469,459 | * 11/1995 | Okuda et al. | 372/46 |
| 5,497,389 | * 3/1996 | Kasukawa et al. | 372/49 |

FOREIGN PATENT DOCUMENTS

| | | |
|---|---|---|
| 34 42 188 | 5/1986 | (DE) . |
| 59-61194 | * 4/1984 | (JP) ........................................ 372/49 |

OTHER PUBLICATIONS

Liu P–L et al.: "Measurements of Intensity Fluctuations of an Ingaasp External cavity Laser" Applied Physics Letters, US, American Institute of Physics. New York, vol. 44, No. 5, Mar. 1, 1984 (Mar. 3, 1984), pp. 481–483, XPOOO700526 ISSN: 0003–6951 Column1, Line 37–Column 2, Line 5.

Hamel W A et al.: "Diagnostics of Asymmetrically Coated Semiconductor Lasers" IEEE Photonics Technology Letters, US, IEEE Inc., New York, vol. 3, No. 7, Jul. 1, 1991, pp. 600–602, XP000218320 ISSN:1401–1135 Table II.

* cited by examiner

Primary Examiner—Teresa M. Arroyo
Assistant Examiner—Quyen Phan Leung
(74) Attorney, Agent, or Firm—Jones Volentine, L.L.C.

(57) ABSTRACT

A semiconductor laser emits light through a front end and a rear end, the front end being coupled to an application system. The front end has a higher reflectivity than the rear end, to reduce problems caused by returning light. More light is therefore emitted through the rear end than through the front end. In a light source, the light emitted through the rear end is monitored by an optical detector coupled to a control circuit, which controls the voltage applied to the semiconductor laser.

12 Claims, 6 Drawing Sheets

SEMICONDUCTOR LASER AND LIGHT SOURCE

BACKGROUND OF THE INVENTION

The present invention relates to a semiconductor laser, and to a light source incorporating a semiconductor laser.

Due to their small size and low cost, semiconductor lasers are widely employed as light sources in fiber-optic communication systems, optical measurement systems, and the like. A typical semiconductor laser operates as a Fabry-Perot resonator, having cleaved facets at both ends that create an optical cavity in which lasing oscillation takes place. If the two facets are uncoated, light is emitted equally through both of them. Light emitted through the front facet is used for the intended application, e.g. communication or measurement. Light emitted through the rear facet is not used, or is used for monitoring the output power of the laser.

To increase the useful optical output of the laser, it is common to coat the end facets so that the front facet has a lower reflectivity than the rear facet. This increases the proportion of the optical power emitted through the front facet, but there is an unwanted consequence: more returning light, that has been reflected outside the laser, re-enters the laser cavity through the front facet. This returning light interferes with the operation of the laser, causing problems such as relative intensity noise and intermodulation distortion. Further details will be given later.

SUMMARY OF THE INVENTION

It is accordingly an object of the present invention to reduce the problems caused by returning light in a semiconductor laser.

Another object is to enhance the accuracy with which the optical output power of a semiconductor-laser light source can be monitored.

A further object is to enhance the accuracy with which the optical output power of a semiconductor laser can be controlled.

The invented semiconductor laser has a front facet and a rear facet, the front facet being optically coupled to an application system such as a communication or measurement system. The reflectivity of at least one of the two facets is modified so that the front facet has a higher reflectivity than the rear facet. Consequently, more light is emitted through the rear facet than through the front facet, and the amount of returning light that re-enters the laser cavity through the front facet is reduced. The linearity of the response of the semiconductor laser to applied voltage and current is thereby improved, enhancing the accuracy with which the output of the semiconductor laser can be controlled.

The invented light source comprises the invented semiconductor laser, an optical detector for converting the optical power emitted through the rear facet to an electrical signal, and a control circuit for controlling the semiconductor laser according to this electrical signal. The increased optical power emitted through the rear facet enhances the accuracy of the electrical signal produced by the optical detector.

DETAILED DESCRIPTION OF THE INVENTION

Embodiments of the invention will be described below with reference to the attached illustrative drawings.

Figure 1:
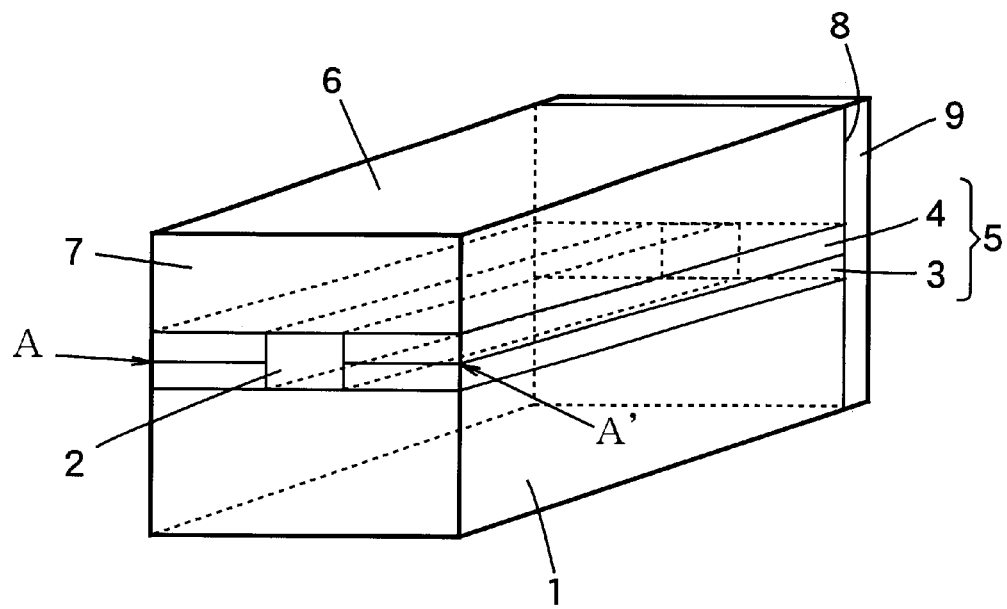
FIG. 1 is a perspective view of a semiconductor laser embodying the present invention.

Referring to FIG. 1, the first embodiment is a semiconductor laser comprising an n-type indium-phosphide (InP) substrate 1, an indium-gallium-arsenide-phosphide (InGaAsP) active layer 2, a p-type InP layer 3 and n-type InP layer 4 that together form a current-confinement layer 5, and a p-type InP cladding layer 6. The active layer 2 has a stripe configuration bounded by the substrate 1 below, the cladding layer 6 above, and the current-confinement layer 5 on both sides.

The semiconductor laser has a front facet 7 and a rear facet 8, which are formed by cleaving and serve as optical mirrors, at least in the area in which the active layer 2 is exposed. The front facet 7 is uncoated, and is optically coupled to an application system such as a communication or measurement system. The rear facet 8 has an antireflection coating 9 comprising a silicon-nitride (SiN) film approximately two thousand angstroms (2000 Å) thick. As a result, while the reflectivity of the front facet 7 is approximately thirty-one percent (31%), the reflectivity of the rear facet 8 is only a few percent (about 2% or 3%).

Figure 2:
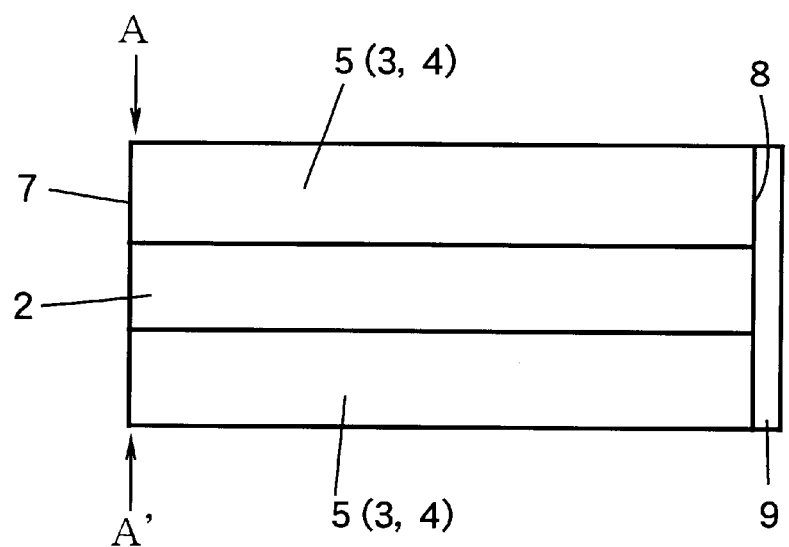
FIG. 2 is a plan view in the A—A plane in FIG. 1.

FIG. 2 shows a plan view through the active layer 2, in the plane marked A—A in FIG. 1.

Next, the operation of this semiconductor laser will be described.

Figure 3:
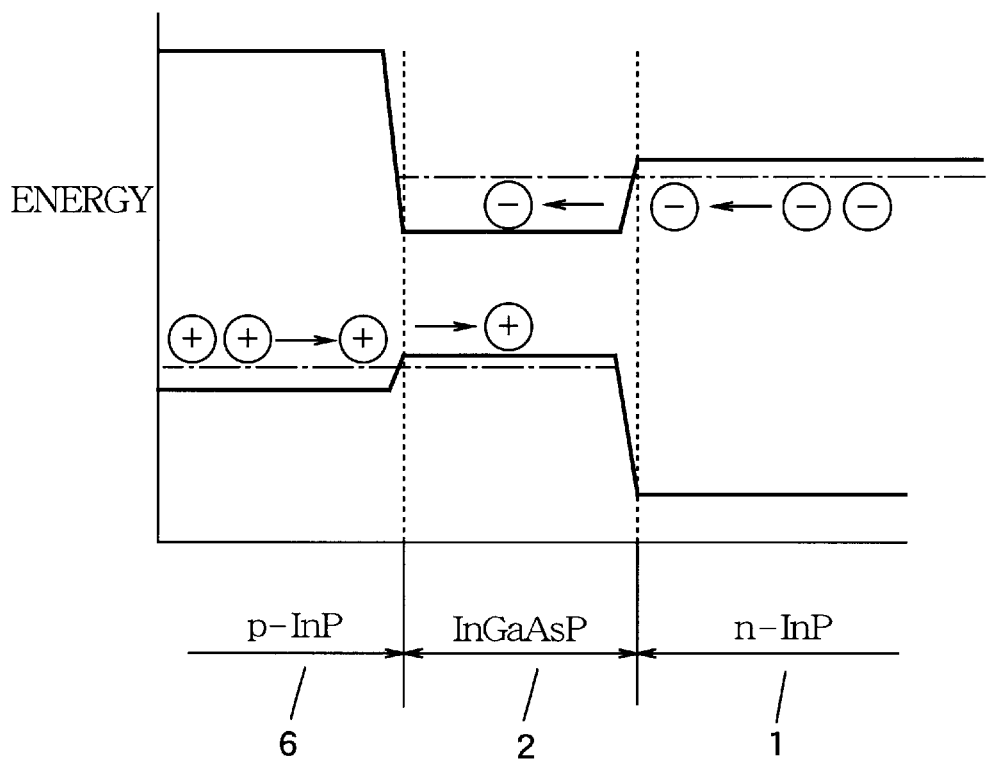
FIG. 3 illustrates energy levels in a semiconductor laser.

When the cladding layer 6 is biased at a positive voltage relative to the substrate 1, electrons in the conduction band in the n-type substrate 1 and holes in the valence band of the p-type cladding layer 6 flow as current into the active layer 2. This current flow is illustrated in FIG. 3, in which the vertical axis indicates energy levels and the horizontal axis indicates the relative positions of the substrate 1, active layer 2, and cladding layer 6. The current-confinement layer 5 concentrates the current flow into the active layer 2, because current cannot flow through the reverse-biased p-n Junction between InP layers 3 and 4.

Electrons and holes recombining in the active layer 2 emit photons. InGaAsP has a higher index of refraction than InP, so the emitted photons are constrained to travel in the active layer 2 by internal reflection at the boundaries with the substrate 1, current-confinement layer 5, and cladding layer 6. Photons encountering electrons in the conduction band in the active layer 2 stimulate the emission of further photons. Photons reflected back and forth between the front facet 7 and rear facet 8 may make many such encounters. When the current density becomes high enough to fill the conduction band in the active layer 2, emission stimulated by such encounters becomes predominant, lasing oscillation commences, and the optical output begins to rise steeply.

Figure 4:
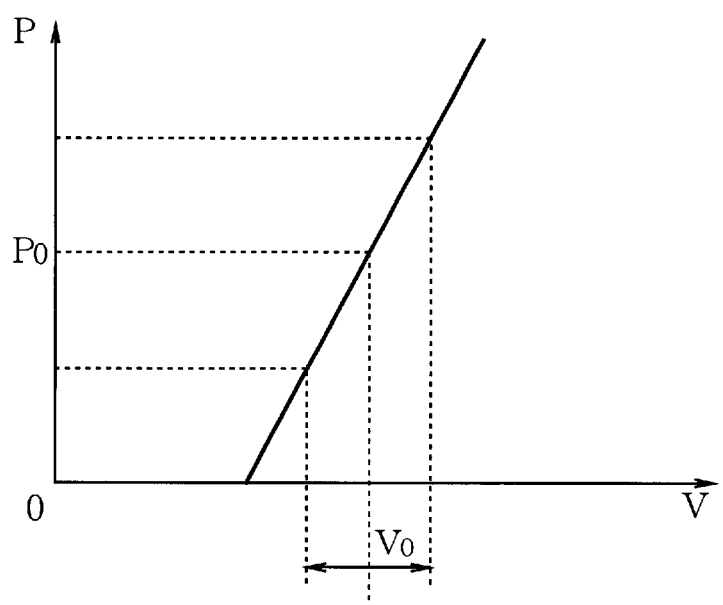
FIG. 4 shows an idealized operating characteristic of a semiconductor laser.

The steep rise is illustrated in FIG. 4, in which the horizontal axis represents applied voltage (V) and the vertical axis represents optical output power (P). During operation, the laser is biased at a voltage $V_0$ high enough to cause lasing oscillation, producing an optical output power $P_0$. If the voltage is varied to adjust or modulate the optical output, e.g. in the range indicated by the arrow around $V_0$, the response is ideally linear; that is, $$(P-P_0)=a_1(V-V_0)$$

where $a_1$ is a constant.

Writing X for $V-V_0$, the optical power P(X) produced in response to X is not exactly a linear function of X, but includes higher-order terms:

$$P(X)=P_0+a_1X+a_2X^2+a_3X^3+$$

In the absence of returning light, however, the coefficients $a_2$, $a_3$, . . . are small enough that the higher-order terms can be ignored. To a close approximation $$P(X)=P_0+a_1X$$

This substantially linear relationship simplifies control of the semiconductor laser in practical applications.

The optical power P(X) can be divided into a component $P_f$ emitted through the front facet 7 and a component $P_r$ emitted through the rear facet 8. If $R_f$ is the reflectivity of the front facet and $R_r$ is the reflectivity of the rear facet, then the ratio of $P_f$ to $P_r$ is given by the following formula:

$$P_f/P_r=(R_r/R_f)^{1/2}(1-R_f)/(1-R_r)$$

In the present case, where $R_f$ is 0.31 and $R_r$ is about 0.02 or 0.03, the ratio $P_f/P_r$ is approximately 0.2. Only about one-sixth of the emitted optical power is emitted through the front facet 7.

Next, the spectrum of the emission will be described.

Figure 5:
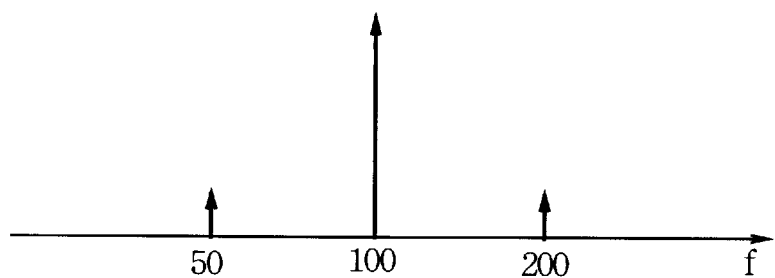
FIG. 5 illustrates the radio-frequency spectrum of a modulated semiconductor laser affected by returning light.

In the absence of returning light, a semiconductor laser emits a narrow line spectrum, but returning light interferes with the lasing operation, so that the higher-order terms in the equation given above cannot be ignored. As a result, the semiconductor laser also emits higher and lower harmonics, as illustrated in FIG. 5. The horizontal axis in FIG. 5 represents frequency (f) in arbitrary units in the radio-frequency (RF) range; the vertical axis represents optical output power. The frequency components at f=50 and f=200 arise from interference caused by returning light.

Figure 6:
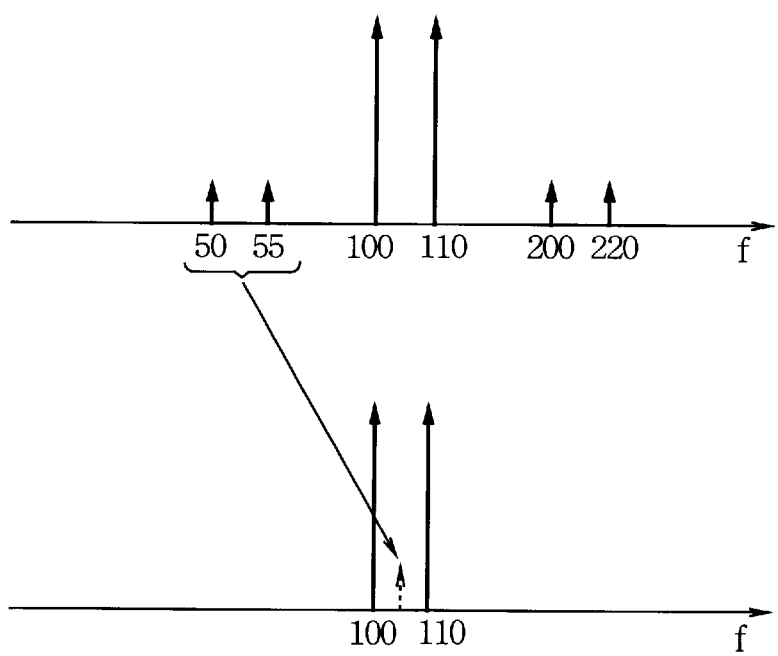
FIG. 6 Illustrates further radio-frequency spectral effects of returning light.

In FIG. 5, these unwanted components are well separated from the main component or carrier wave at f=100, but when the returning light includes other carrier waves with different frequencies, as may occur in frequency-division multiplexing communication systems, interference may appear near the carrier frequency. This is illustrated in FIG. 6, where carrier waves with frequencies of f=100 and f=110 produce subharmonics at f=50 and f=55, which combine to produce interference at f=105. (The horizontal axes in FIG. 6 both represent RF frequency, while the vertical axis represents optical power.)

Figure 7:
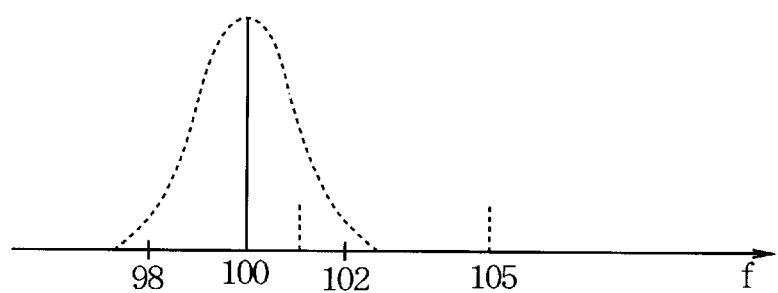
FIG. 7 shows a case in which filtering caused intermodulation distortion.

If sufficiently separated from the carrier frequency, this type of interference can still be eliminated by a filter in the receiving device. FIG. 7 shows an example in which a filter having a passband from substantially f=98 to f=102 is used to receive the carrier wave at f=100 while eliminating the interference at f=105. (The horizontal axis again represents RF frequency, while the vertical axis represents optical power.) This filter fails to eliminate similar interference occurring at f=101, however. If present, such interference will contaminate the received signal, causing what is termed intermodulation distortion.

Figure 8:
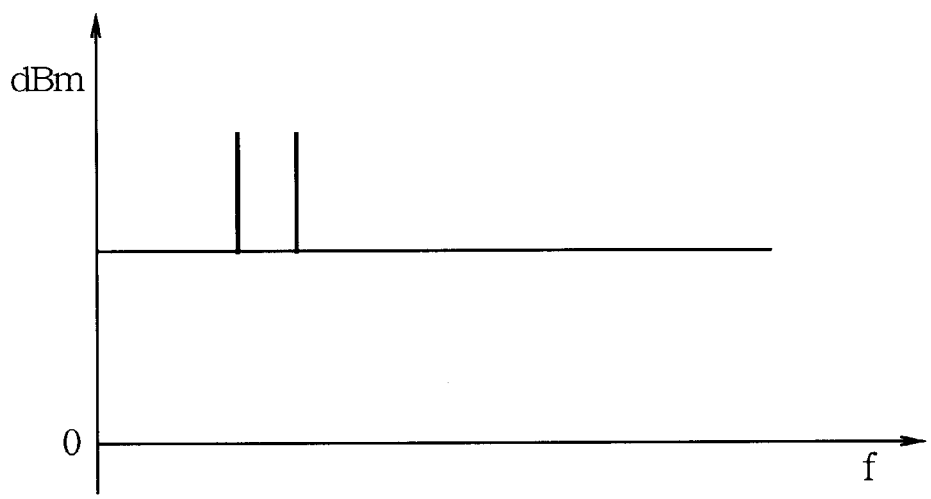
FIG. 8 illustrates spurious noise.

Returning light can also cause the laser to oscillate in two different modes, producing spurious emission in addition to the desired emission, as illustrated in FIG. 8. (The horizontal axis in FIG. 8 represents RF frequency; the vertical represents optical power in milliwatt decibels.) Such spurious emission is particularly troublesome in communication systems employing frequency-division multiplexing.

Even when the returning light is of the same frequency as the emitted light, the phase of the returning light does not generally match the phase of the emitted light, so the returning light still interferes with the operation of the semiconductor laser, causing intermodulation distortion.

As a general result of all of the effects noted above, if the output of the semiconductor laser is modulated by varying the applied voltage and current, the semiconductor laser does not respond as intended; the output is distorted by relative intensity noise. Relative intensity noise can be tolerated to some extent in systems employing frequency modulation or binary phase-shift keying, but causes significant problems in systems in which information is partly or wholly encoded as variations in the signal intensity, as in systems employing amplitude modulation, quadrature amplitude modulation, quadrature phase-shift keying, and other such modulation methods.

By decreasing the reflectivity of the rear facet 8 of the semiconductor laser, and thereby reducing the intensity of the light emitted through the front facet 7, the present embodiment also reduces the intensity of the returning light that enters the laser cavity, in comparison to the intensity of the light of the carrier frequency oscillating in the laser cavity. The present embodiment thereby alleviates all of the problems illustrated in FIGS. 5 to 8, and increases the linearity of the response of the laser to the applied voltage. The invented semiconductor laser can accordingly be accurately controlled, and produces relatively noise-free optical output.

Next, a second embodiment will be described.

Figure 9:
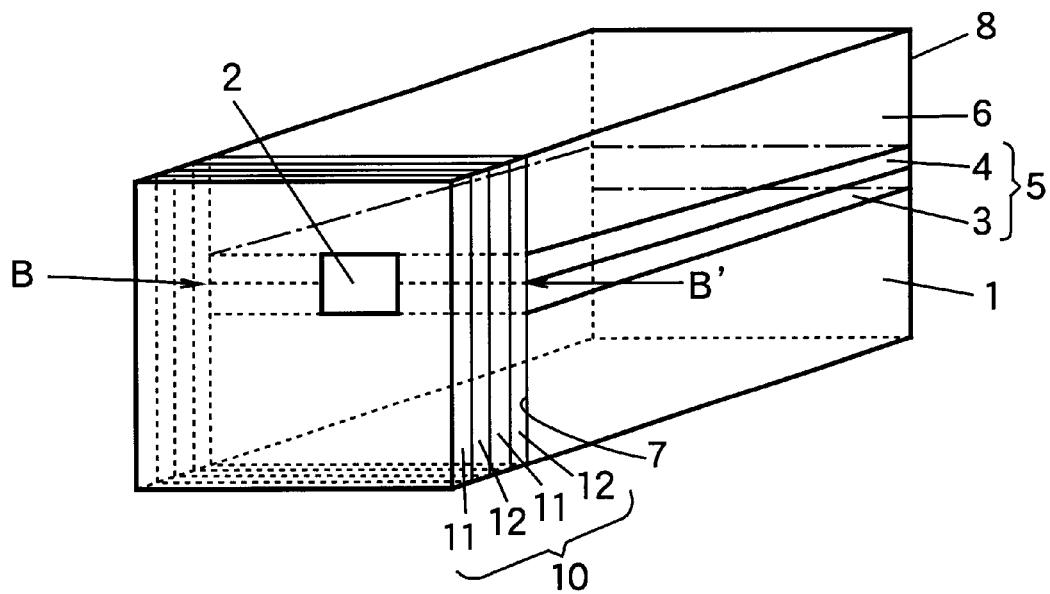
FIG. 9 is a perspective view of another semiconductor laser embodying the present invention.

Referring to FIG. 9, the second embodiment is a semiconductor laser with a substrate 1, active layer 2, current-confinement layer 5, and cladding layer 6 similar to the corresponding elements with the same reference numerals in FIG. 1, but the front facet 7 has a reflective coating 10, while the rear facet 8 is uncoated. The reflective coating 10 comprises two silicon dioxide ($SiO_2$) layers 11, each approximately 2500 Å thick, alternating with two silicon (Si) layers 12, each approximately 1000 Å thick. From front to back, the order of layers is $SiO_2$-Si-$SiO_2$-Si. This coating 10 raises the reflectivity of the front facet to approximately 90%. The reflectivity of the uncoated rear facet is approximately 31%.

Figure 10:
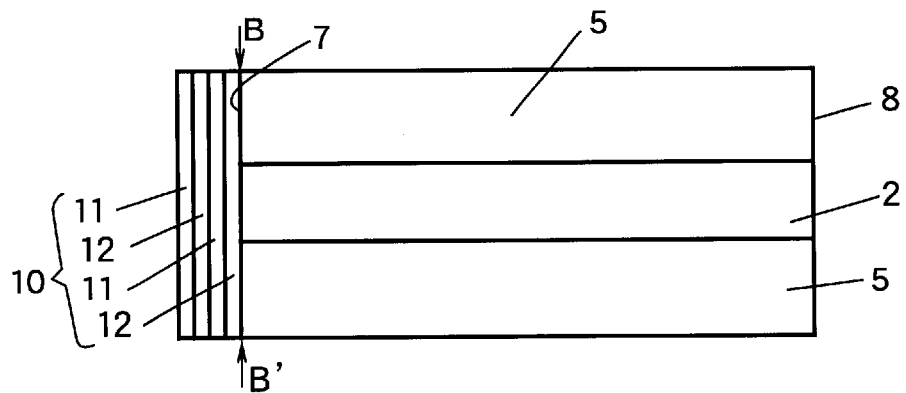
FIG. 10 is a plan view through plane B—B in FIG. 9.

FIG. 10 shows a plan view of the second embodiment through the plane marked B—B in FIG. 9.

The formula given above indicates that the ratio $P_f/P_r$ of optical power emitted through the front facet 7 to optical power emitted through the rear facet 8 is now approximately 0.09. Only about one-twelfth of the optical power is emitted through the front facet 7.

The amount of returning light that enters the active layer 2 through the front facet 7 is reduced even more than in the first embodiment, in part because less light is emitted through the front facet 7 to begin with, and in part because the increased reflectivity of the front facet 7 shuts out a greater proportion of the returning light. Thus the second embodiment is even more effective than the first embodiment in reducing intermodulation distortion and spurious noise.

Next, a third embodiment will be described.

Figure 11:
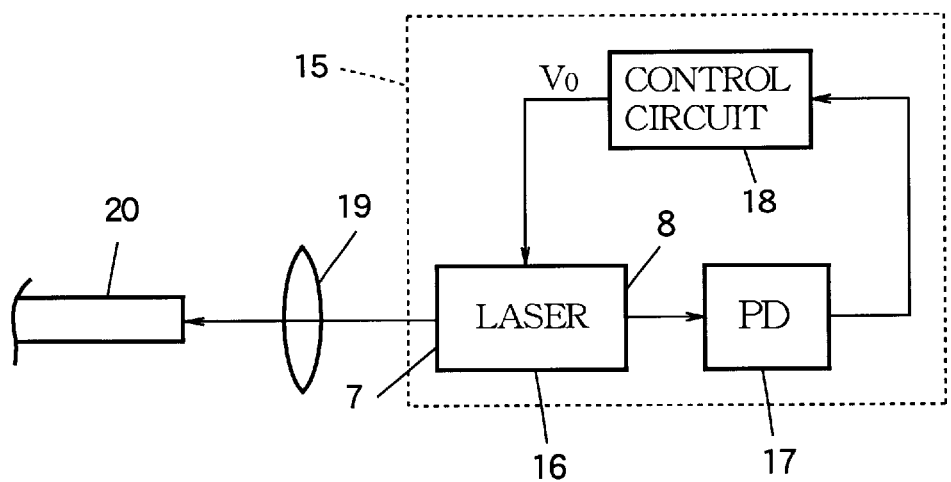
FIG. 11 is a schematic diagram illustrating the invented light source.

Referring to FIG. 11, the third embodiment is a light source 15 comprising a semiconductor laser 16 of the invented type, an optical detector such as a photodiode (PD) 17, and a control circuit 18. The semiconductor laser 16 may be coated on either the rear facet 8, as in the first embodiment, or the front facet 7, as in the second embodiment. Light emitted from the rear facet 8 of the semiconductor laser 16 is converted to an electrical signal by the photodiode 17. The electrical signal is received by the control circuit 18, which controls the bias voltage $V_0$ applied to the semiconductor laser 16. The semiconductor laser 16, photodiode 17, and control circuit 18 operate as a negative feedback loop, thereby maintaining a constant optical output from the semiconductor laser 16.

The light emitted from the front facet 7 of the semiconductor laser 16 is coupled through a lens 19 into an optical fiber 20 that constitutes part of, for example, a communication system. The optical power supplied to the optical fiber is held at a substantially constant level by the negative feedback described above.

Use of the invented semiconductor laser 16 has two advantages. One is that most of the light returning from the optical fiber 20 through the lens 19 is reflected from the front facet 7 of the semiconductor laser 16, and therefore does not cause intermodulation distortion or otherwise interfere with the operation of the semiconductor laser 16. The other advantage is that the increased amount of optical power emitted through the rear facet 8 enables the photodiode 17 to monitor the intensity of the optical output of the semiconductor laser 16 more accurately than would be possible if a conventional semiconductor laser were used. The optical output of the invented light source 15 can therefore be controlled with enhanced accuracy.

As a variation of the third embodiment, the semiconductor laser 16 and photodiode 17 can be combined into a single device. Using the same reference numerals as in FIGS. 1 and 11, FIG. 12 shows an example of this combination in which the semiconductor laser 16 has an antireflection coating 9 on the rear facet 8, as in the first embodiment.

Figure 12:
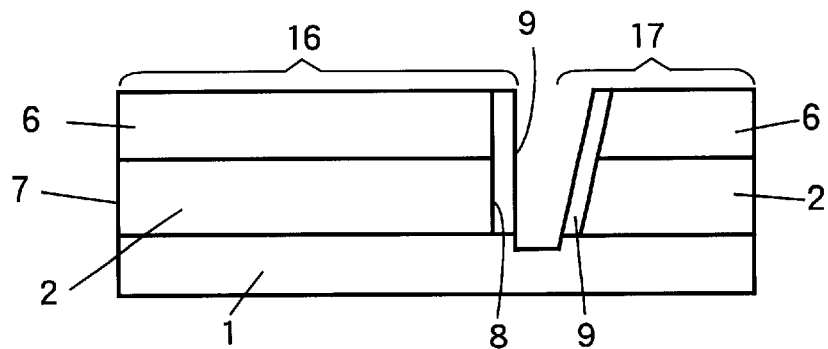
FIG. 12 is a side view of still another semiconductor laser embodying the present invention.

The semiconductor laser 16 and photodiode 17 in FIG. 12 are formed on the same substrate 1, and have the same active layer 2 and cladding layer 6, but the active layer 2 and cladding layer 6 are cleaved to separate the semiconductor laser 16 physically from the photodiode 17. Methods of forming this cleaved structure, by etching for example, are well known. The antireflection coating 9 covers both the rear facet 8 of the semiconductor laser 16 and the front facet of the photodiode 17, thereby reducing reflection both of light exiting the semiconductor laser 16 and light entering the photodiode 17.

During operation, the substrate 1 is biased at, for example, the ground potential. The cladding layer 6 in the semiconductor laser 16 is biased at a positive potential adequate to produce lasing oscillation, while the cladding layer 6 in the photodiode 17 is biased at a negative potential. Current flows through the photodiode 17 in proportion to the number of carriers generated in the photodiode 17 by light emitted from the rear facet 8 of the semiconductor laser 16. The control circuit 18 in FIG. 11 is coupled by an electrode (not visible) to the cladding layer 6 of the photodiode 17, detects the current flowing through the photodiode 17, and controls the voltage applied to the cladding layer 6 of the semiconductor laser 16 in a manner responsive to this current.

Combining the semiconductor laser 16 and photodiode 17 has well-known advantages such as reduced size, simplified handling, self-alignment of the optic axes, and reduced cost. In addition, the novel antireflection coating 9 provides the advantages noted in the first embodiment, and the further advantage of more sensitive and accurate detection of the intensity of light emitted by the semiconductor laser 16, because more of this light enters the active layer 2 in the photodiode 17.

Figure 13:
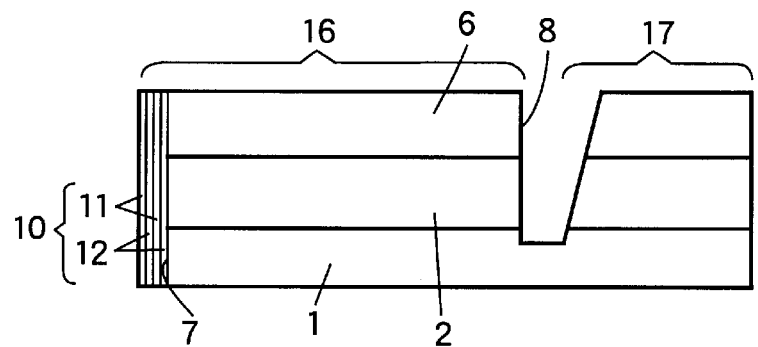
FIG. 13 is a side view of yet another semiconductor laser embodying the present invention.

FIG. 13 illustrates a similar combined device employing the semiconductor-laser structure of the second embodiment, using the same reference numerals as in FIGS. 9 and 11. In this case a reflective coating 10 is applied to the front facet 7 of the semiconductor laser 16, while the rear facet 8 and the facing facet of the photodiode 17 are left uncoated. Compared with the device in FIG. 12, the device in FIG. 13 admits less light to the photodiode 17, but also admits less returning light through the front facet 7 of the semiconductor laser 16, as noted in the second embodiment.

Incidentally, it is desirable for the front facet of the photodiode 17, which faces the rear facet 8 of the semiconductor laser 16, to be slanted as shown in the drawings, to reduce reflection of light back into the active layer 2 of the semiconductor laser 16.

Various advantages of the invented semiconductor laser and light source have been noted above, but a further advantage should be pointed out. By reducing the problems caused by returning light, the invention enables optical systems in which the invention is employed to be simplified by the elimination of means that have been used to divert returning light in the past. Three of these means are illustrated in FIGS. 14 to 16, using the same reference numerals for common elements.

Figure 14:
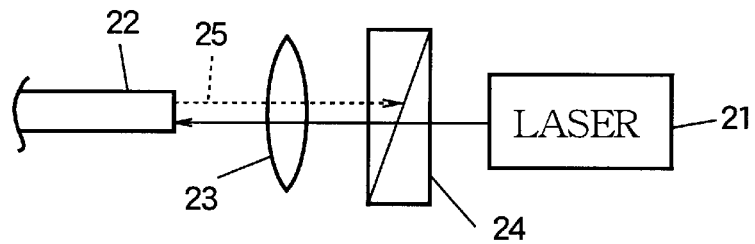
FIG. 14 illustrates a prior-art method of avoiding problems caused by returning light.

In FIG. 14, a semiconductor laser 21 is coupled to an optical fiber 22 through a lens 23, and an optical isolator 24 is inserted between the semiconductor laser 21 and lens 23 to prevent returning light 25 from reaching the semiconductor laser 21. The optical isolator 24 is effective, but is also costly and takes up space. In many applications, the present invention enables the optical isolator 24 to be eliminated.

Figure 15:
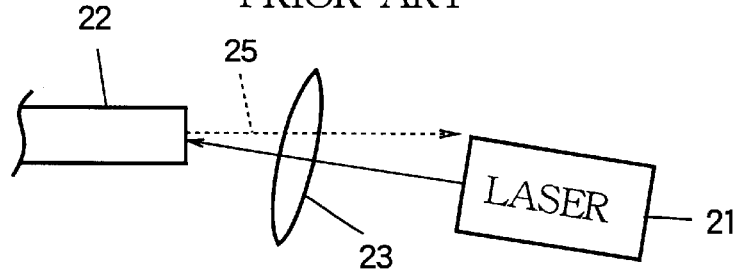
FIG. 15 illustrates another prior-art method of avoiding problems caused by returning light.

In FIG. 15, the semiconductor laser 21 and lens 23 are disposed off-axis with respect to the optical fiber 22, so that returning light 25 misses the active layer of the semiconductor laser 21. This off-axis coupling is difficult to align, however, and has a high insertion loss. Compared with an on-axis coupling, that is, less of the light emitted by the semiconductor laser 21 actually enters the optical fiber 22.

Figure 16:
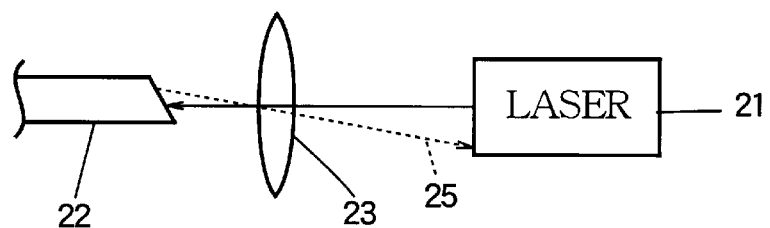
FIG. 16 illustrates still another prior-art method of avoiding problems caused by returning light.

In FIG. 16, the butt end of the optical fiber 22 is cut at an angle, so that returning light 25 is refracted away from the active layer of the semiconductor laser 21. This arrangement also increases the insertion loss of the coupling, but is simpler and less expensive than the methods illustrated in FIGS. 14 and 15. If necessary, the arrangement in FIG. 16 can be used in combination with the invented semiconductor laser or light source to further reduce the problems caused by returning light.

The invention has been described in relation to a semiconductor laser of the Fabry-Perot type, but the invention can be practiced with any type of semiconductor laser that emits light through front and rear facets, including semiconductor lasers with distributed Bragg reflectors at both ends, and semiconductor lasers of the distributed feedback type.

A conventional distributed-feedback semiconductor laser, for example, has an antireflection coating on the front facet, both to increase the optical output and to suppress Fabry-Perot oscillation. The invention can be practiced by moving this antireflection coating to the rear facet.

In a conventional semiconductor laser employing distributed Bragg reflectors, the reflectors are designed to reflect more light of the lasing wavelength at the back end of the laser than at the front end. The invention can be practiced by reversing this relationship, so that more light is reflected by the Bragg reflector at the front end.

When the invention is practiced in a Fabry-Perot type of semiconductor laser, the coatings are not limited to the specific SiN antireflection coating 9 and multilayer reflective coating 10 described in the preceding embodiments. Also, coatings may be employed on both the front and rear facets, instead of on only one facet.

Those skilled in the art will recognize that further variations are possible within the scope claimed below.

What is claimed is:

1. A light source for providing light to an application system, comprising:

a semiconductor laser having a front end and a rear end, for emitting light through said front end and said rear end, the light emitted through said front end being provided to said application system;

an optical detector for receiving the light emitted through said rear end and converting the received light to an electrical signal; and a control circuit coupled to said semiconductor laser and said optical detector, for applying a voltage to said semiconductor laser and controlling said voltage responsive to said electrical signal, thereby controlling intensity of the light emitted by said semiconductor laser; wherein said front end has a higher reflectivity than said rear end, causing said semiconductor laser to emit more light through said rear end than through said front end.

2. The light source of claim 1, wherein said semiconductor laser has an antireflection coating disposed on said rear end, for reducing the reflectivity of said rear end.

3. The light source of claim 1, wherein said semiconductor laser has a reflective coating disposed on said front end, for increasing the reflectivity of said front end.

4. The light source of claim 1, wherein said semiconductor laser and said optical detector are formed on a common substrate.

5. The light source of claim 4, wherein the rear end of said semiconductor laser and a facing end of said optical detector are both coated with an antireflection coating.

6. The light source of claim 4, wherein said antireflection coating comprises silicon nitride.

7. A semiconductor laser having a front end and a rear end, emitting light through said front end and said rear end, the light emitted through said front end being provided to an optical application system, comprising:

an n-type indium-phosphide substrate;

an indium-gallium-arsenide-phosphide active layer disposed on said substrate, extending from said front end to said rear end, for emitting said light;

a p-type indium-phosphide current-confinement layer, disposed on said n-type indium-phosphide substrate, surrounding said indium-gallium-arsenide-phosphide active layer;

an n-type indium-phosphide current-confinement layer, disposed on said p-type indium-phosphide current-confinement layer, surrounding said indium-gallium-arsenidephosphide active layer;

a p-type indium-phosphide cladding layer disposed on said n-type indium-phosphide current-confinement layer and said indium-gallium-arsenide-phosphide active layer; and an antireflection coating incorporating a silicon-based insulating material, disposed on said rear end, for reducing the reflectivity of said rear end, so that said front end has a higher reflectivity than said rear end and more light is emitted through said rear end than through said front end.

8. The semiconductor laser of claim 7, wherein said antireflection coating comprises a silicon-nitride film.

9. The semiconductor laser of claim 7, wherein the light emitted through said front end is used for an application purpose other than monitoring and control of the semiconductor laser.

10. A semiconductor laser having a front end and a rear end, emitting light through said front end and said rear end, the light emitted through said front end being provided to an optical application system, comprising:

an n-type indium-phosphide substrate;

an indium-gallium-arsenide-phosphide active layer disposed on said substrate, extending from said front end to said rear end, for emitting said light;

a p-type indium-phosphide current-confinement layer, disposed on said n-type indium-phosphide substrate, surrounding said indium-gallium-arsenide-phosphide active layer;

an n-type indium-phosphide current-confinement layer, disposed on said p-type indium-phosphide current-confinement layer, surrounding said indium-gallium-arsenidephosphide active layer;

a p-type indium-phosphide cladding layer disposed on said n-type indium-phosphide current-confinement layer and said indium-gallium-arsenide-phosphide active layer; and a reflective coating incorporating a silicon-based insulating material, disposed on said front end, for increasing the reflectivity of said front end, so that said front end has a higher reflectivity than said rear end and more light is emitted through said rear end than through said front end.

11. The semiconductor laser of claim 10, wherein said reflective coating comprises alternate layers of silicon dioxide and silicon.

12. The semiconductor laser of claim 10, wherein the light emitted through said front end is used for an application purpose other than monitoring and control of the semiconductor laser.

* * * * *